(12) United States Patent
Ogino et al.

(10) Patent No.: US 6,412,754 B1
(45) Date of Patent: Jul. 2, 2002

(54) PRESSURE CONTROL DEVICE

(75) Inventors: Hiromitsu Ogino; Takashi Ogawa, both of Shizuoka-ken (JP)

(73) Assignee: Nisshinbo, Industries, Inc., Tokyo (JP)

( * ) Notice: Subject to any disclaimer, the term of this patent is extended or adjusted under 35 U.S.C. 154(b) by 0 days.

(21) Appl. No.: 09/629,247

(22) Filed: Jul. 27, 2000

(30) Foreign Application Priority Data

Aug. 3, 1999 (JP) ............................................. 11-220038

(51) Int. Cl.$^7$ ................................................. F16K 31/02
(52) U.S. Cl. ................................. 251/129.15; 303/119.3
(58) Field of Search ................... 251/129.15; 303/119.3; 137/884

(56) References Cited

U.S. PATENT DOCUMENTS

| | | | | |
|---|---|---|---|---|
| 4,898,360 A | * | 2/1990 | VonHoyn et al. | 251/129.15 X |
| 5,275,478 A | * | 1/1994 | Schmitt et al. | 251/129.15 X |
| 5,449,019 A | * | 9/1995 | Hara | 303/119.2 X |
| 5,449,227 A | * | 9/1995 | Steinberg et al. | 251/129.15 X |
| 5,452,948 A | * | 9/1995 | Cooper et al. | 137/884 |
| 5,762,318 A | * | 6/1998 | Staib et al. | 251/129.15 |
| 5,941,282 A | * | 8/1999 | Suzuki et al. | 251/129.15 X |
| 6,000,679 A | * | 12/1999 | Reuter et al. | 251/129.15 |
| 6,079,798 A | * | 6/2000 | Hosoya | 137/884 X |

OTHER PUBLICATIONS

Japanese Patent application Publication No. 9–267735 (with English abstract).
Japanese Patent application Publication No. 9–263223 (with English abstract).
Japanese Patent application Publication No. 9–511964 (with English abstract).
Copy of priority document No. 11–220038.

* cited by examiner

Primary Examiner—William C. Doerrler
Assistant Examiner—John Bastianelli
(74) Attorney, Agent, or Firm—Alan W. Cannon; Bozicevic, Field & Francis LLP

(57) ABSTRACT

A flexible connection arrangement is provided which is useful in a pressure control device for a braking system, for example, and a pressure control device utilizing the flexible arrangement is described. The flexible connection arrangement eliminates the need of an interrupting conductor, thereby reducing the number of components required in a pressure control device and reducing manufacturing cost, complexity and the size of the device. The connection arrangement includes a flexible, elastic arm which may be integrated with a bobbin of a coil, and a lead wire terminal which may be embedded in an elastic arm and extend therefrom to directly electrically connect with a control circuit board. The flexibility of the elastic arm allows relative movement between the coil and the control circuit board without damaging the electrical connections therebetween.

17 Claims, 4 Drawing Sheets

PRESSURE CONTROL DEVICE

TECHNICAL FIELD

This invention relates to a pressure control device suitable for hydraulic brake control of a motor vehicle in systems such as, anti-lock brake systems and traction control systems for example.

BACKGROUND OF THE INVENTION

Certain types of pressure control devices, such as some that are used in the automobile industry for antilock braking systems, include a plurality of solenoid valves. Each of these solenoid valves is equipped with a dome type valve body and a doughnut type coil. Each valve body is installed in a valve block which has brake fluid channels running therethrough. A cover, which protects an underlying control circuit board, is installed over the valve bodies and positioned adjacent the coils relative to the valve body. The cover is installed on the valve block, in a position such each valve body is surrounded by a corresponding coil.

With regard to the subassembly of the coil and valve body, a lead wire terminal extends directly above the coil and is electrically connected with the circuit board by soldering. Because the coil moves during operation, it is critical to interconnect the coil and the circuit board in a manner which will not disturb or stress the soldered electrical interconnect. To address this critical feature, it is known to provide an interrupting conductor which has some degree of flexibility so as to help present stressing of the electrical interconnect. Among the flexible components that may be included in such interrupting conductors are, e.g., bus bars, lead wires, or accordion bars, which are positioned between the coil and the control circuit board. The flexibility of the interrupting conductor helps to reduce the transmission movements of the coil to the circuit board and soldered electrical interconnect. This technology is disclosed in the Japanese Patent Application Publication Nos. 9-26773b, 9-263223, and 9-511964.

The conventional constructions as described above have the disadvantage that, in order to provide the desired flexibility, an additional part, such as an interrupting conductor is required, which leads to higher manufacturing and assembly costs, thereby making the component more expensive to the end user. The conventional arrangements are produced with the interrupting conductor embedded in a cover, which requires an installment tool to hold the parts during assembly. This also increases the cost of manufacturing and assembly, due to the additional tool required and the increased complexity of the assembly process. The interrupting conductor must be designed not to interfere with other components as well as be designed to be of a minimum length. One end of the interrupting conductor must be electrically connected to the lead wire terminal of the coil and the other end to the control circuit board. This, compared to a construction which directly connects the lead wire terminal of the coil to the control circuit board, this construction is considerably more complex and costly to manufacture.

DESCRIPTION OF THE FIGURES

The above and other objects and the attendant advantages of the present invention will become readily apparent by reference to the following detailed description when considered in conjunction with the accompanying drawings wherein.

DESCRIPTION OF THE INVENTION

Figure 1:
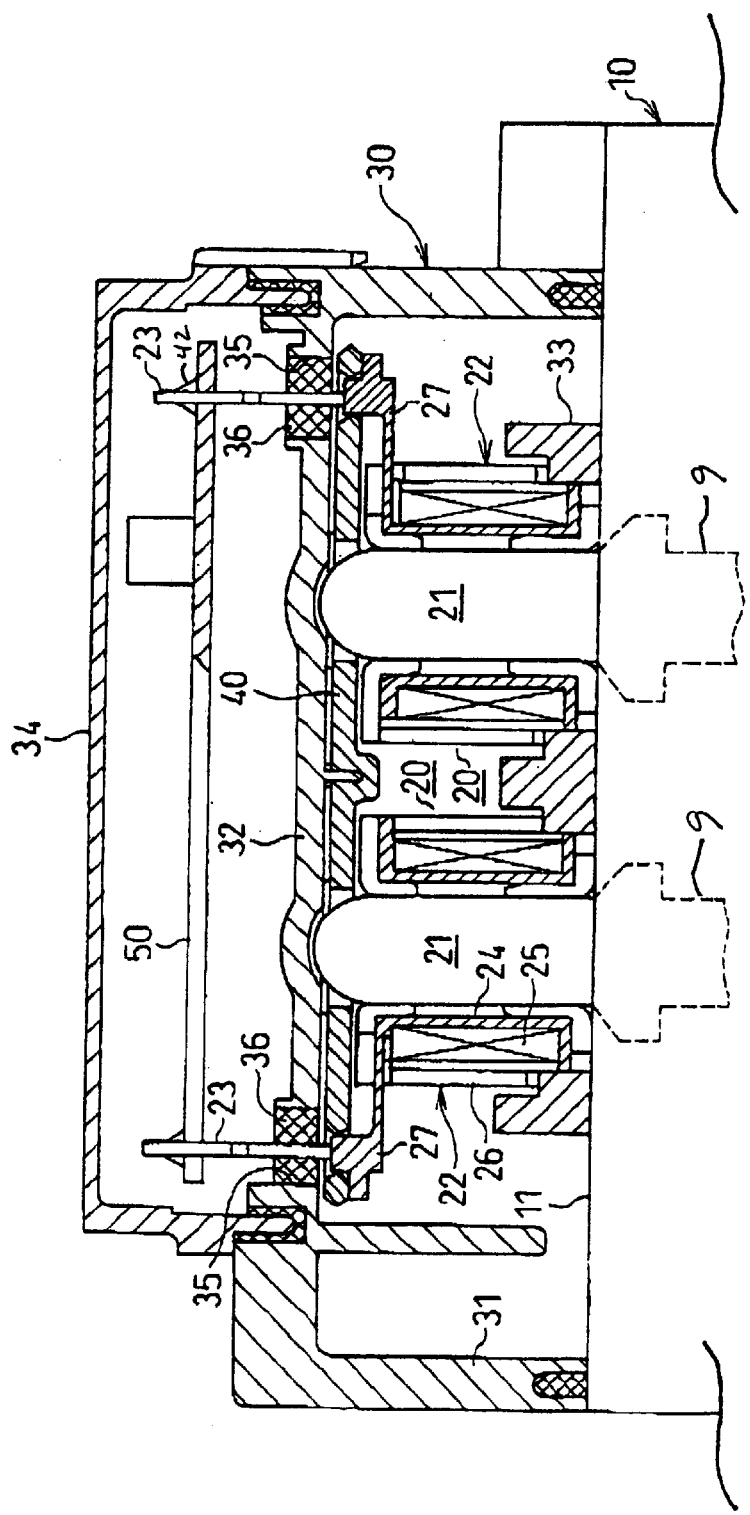
FIG. 1 is a partial cross-sectional view of a pressure device according to the present invention.

FIG. 1 shows one example of a pressure control device. A valve block 10 is provided with channels 9 which may be opened to allow flow/pressure communication, or closed to prevent communication, by opening or closing a respective dome type valve body 21. Valve bodies 21 extend from surface 11 of valve block. Valve bodies 21 are shown in their closed positions, and are movably downward from the positions shown to open communication. A cap cover 30 is provided to enclose the valve body arrangements. The cap cover includes side plates 31 and top board 32. Cap cover 30 is mounted by fixing side plates 31 to the surface 11 of the valve block by, e.g., bolts, screws or the like.

A cushioning member 40, which may be made of rubber or resin, or the like, for example, is placed between an inner surface of top board 32 cover 30 and the solenoid valves 20, and particularly between the doughnut type coils 22 of the valves 20 and the top board 32. A curb frame 33 is provided to interact with each respective coil 22, to contain the respective coil 22 within certain radial and axial limits. A control circuit board 50 is fixed on the outer or top side of top board 32 and is electrically connected to the coils 22 as described below. An electronic circuit is printed on the control circuit board 50 and a control chip is installed on the control circuit board 50. The control circuit board 50 is protected by an end cover 34 installed on the cover 30.

A window opening 35 is provided through the top board 32 to allow electrical interconnections between the solenoid valves 20 and circuit board 50 to pass therethrough. Lead wire TERMINAL 23, which is electrically connected to coil 22 on one side of top board 32, passes though window hole 35 and is electrically connected to circuit board 50 on the opposite side of top board 35. A potting material 36, such as a soft resin, seals the window hole 35 around the lead wire terminal 23.

Each coil 22 is equipped with a resin bobbin 24, a solenoid coil 25 rolled over the bobbin 24, and a permeable case 26. The lead wire terminal 23 is provided at and electrically connected with each end of the solenoid coil 25.

Figure 2:
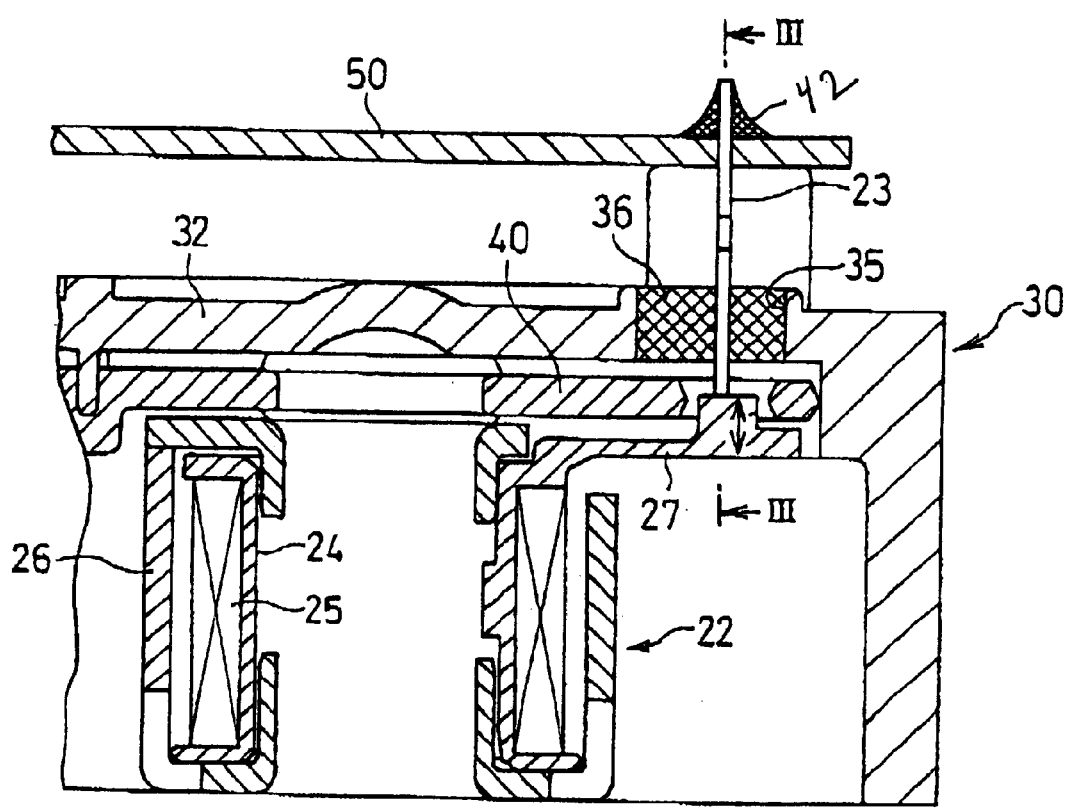
FIG. 2 is an enlarged partial, cross sectional view showing an interrelationship between a solenoid valve, a circuit board, and the interconnection therebetween.
Figure 3:
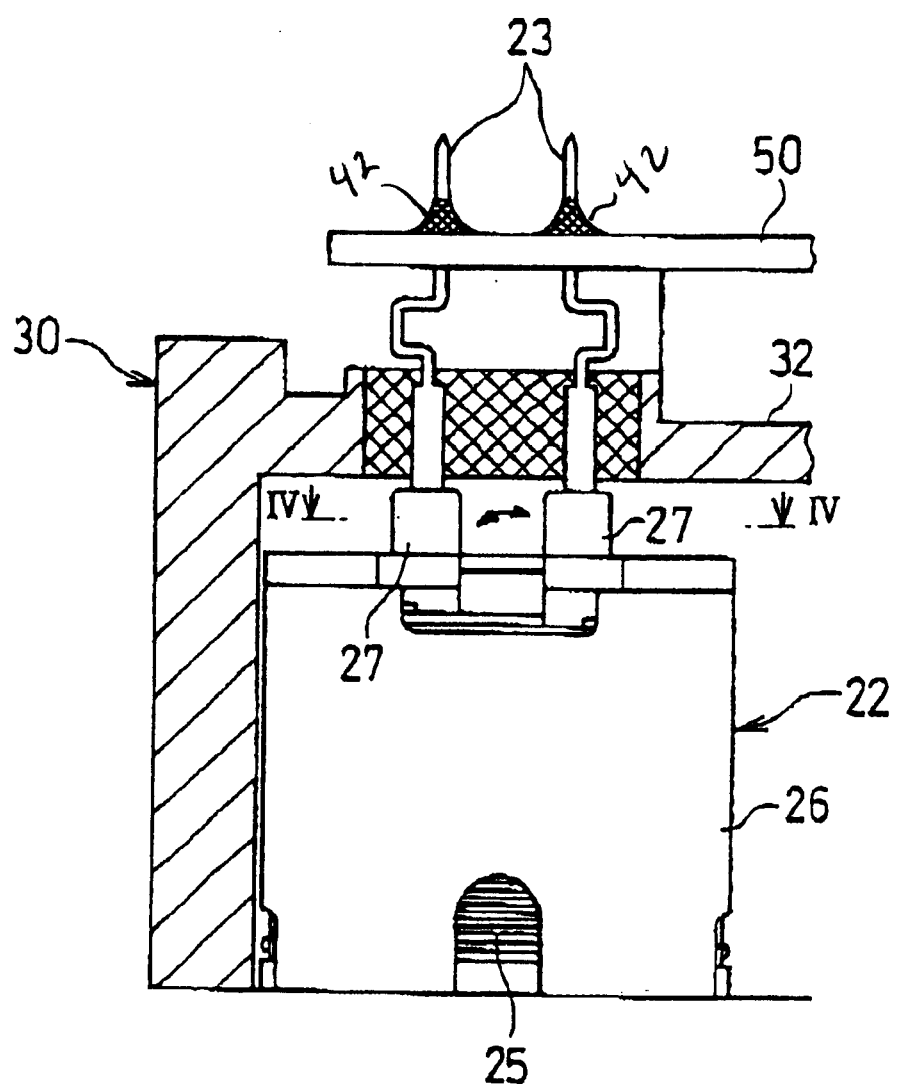
FIG. 3 is a cross-sectional view of FIG. 2 taken along the line III—III.

FIGS. 2 and 3 each show an enlarged partial view of a pressure control device, with particular attention paid to an electrical connection between a solenoid valve 20 and control circuit board 50. A pair of flexible, elastic arms 27, 27 are integrally formed on the upper portion of bobbin 24, and extend radially away from bobbin 24, as shown in FIG. 2. Alternatively, one elastic arm 27 may be formed on one bobbin 24, and a pair of the lead wire terminals 23, 23 may share one elastic arm 27. Known solenoid valves have connection terminals which extended upwardly (or axially) from the coil to be connected with the control circuit board. The present invention, with its radially extending elastic arms 27, allows more flexibility in design positioning of the lead wire terminal 23. That is, providing a directional elastic arm 27 (the direction, shape and length of which may be varied) many different designs and relative positioning of the components are possible, thereby allowing not only more reliable connections, but more flexibility in designing the arrangements to be compact. Thus, various designs in positioning the electrical connection between the pair of lead wire terminals 23, 23 and the control circuit board 50 become possible.

Figure 4:
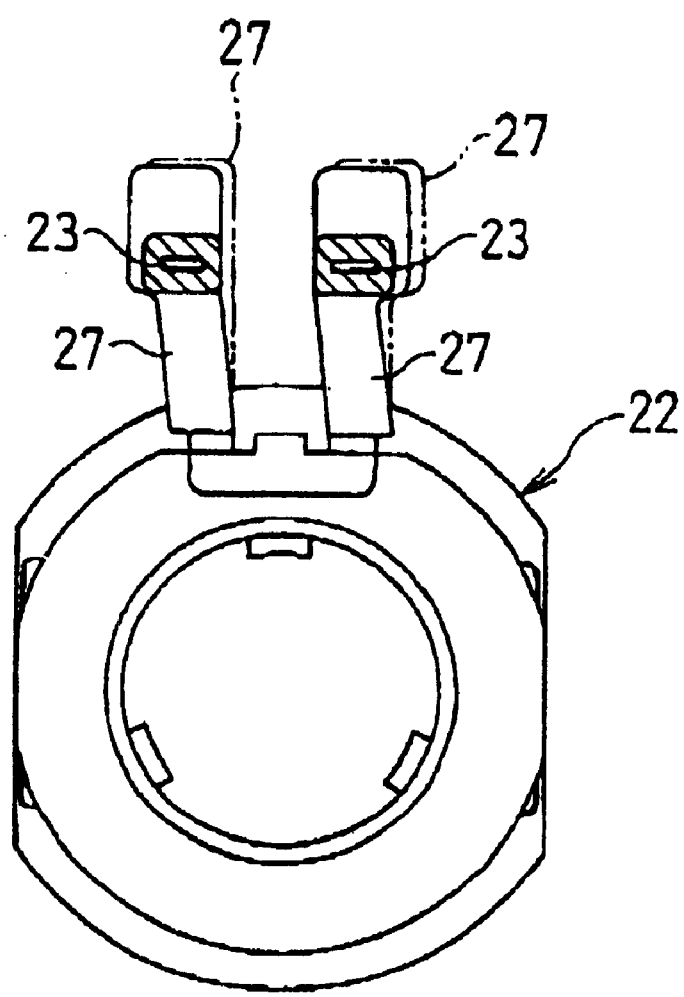
FIG. 4 is a cross-sectional view of FIG. 3 taken along the line IV—IV.

For example, in FIG. 2, the respective lead wire terminal 23, is arranged along elastic arm 27 or is embedded in the elastic arm 27 (e.g., see FIG. 4) and further extends vertically upward from an end portion of elastic arm 27. The lead wire terminal 23 passes through window opening 35, as described above, and through control circuit board 50. The end of the lead wire terminal which passes through the control circuit board 50 is soldered or welded 42 to the top side of the control circuit board 50 (e.g., see FIG. 2). This structure allows relative movement of the lead wire terminal 23 between the coil 20 and the control circuit board 50, without breaking or otherwise disrupting the solder connection of the lead wire terminal to the control circuit board 50.

The control circuit board 50 may have a variety of chips mounted on it, and the chips are often concentrated centrally on the board 50, with the peripheral portion of the control circuit board 50 tending to comprise mainly dead space. Thus, it is advantageous to take advantage of the dead space by locating the lead wire terminals 23, 23 there and forming the solder joints on the peripheral portion. The present invention facilitates such peripheral placement of the lead wire terminals 23,23 thereby freeing up the central region of the control circuit board 50 for maximum usage by placement and arrangement of circuits thereon. This enables further minimization/miniaturization of the size of the control circuit board 50. Alternatively, the flexibility provided by the designs of the present application would also allow central placement of the lead wire terminals on the control circuit board, should it be advantageous to do so, due to a particular circuit design, for example.

Due to the flexibility of the elastic arms 27, movement of the solenoid valve 20 (and particularly the coil 22) in an axial direction can be tolerated without disrupting or breaking the electrical connection between the coil 20 and the control circuit board 50. The elastic arms 27 provide some capacitance by bending or flexing during the axial movements of the coil, thereby reducing or eliminating stresses on the electrical connections at both ends of the lead wire 23 which would otherwise occur during such movements. The elasticity of the elastic arms enables the arms 27 to return to their normal configuration at such time that the coil returns to its starting position. In the same manner, elastic arms 27 also allow torquing (radial) or tilting motions of the coil to take place, while protecting the integrity of the electrical connections. The lead wire terminal 23 may be designed in a corrugated, or accordion folded configuration (e.g., see FIG. 3), to allow movements of the coil and to extend with the elastic arm 27 as it flexes, without pulling at either terminal end of the lead wire 23, so as not to disturb the electrical connections.

Although the elastic arms 27 may be formed to extend straight in a radial direction away from the coils 22, as shown in FIG. 2, it is noted that the present invention is not limited to straight configurations. For example, in addition to forming the lead wires 27 to have an accordion-folded shape, the elastic arms may be similar configured to have an accordion shape, thereby providing further capacitance or "slack" to be taken up by movements of the coil with respect to the control circuit board. In this example, the lead wires can have conforming accordion bends, allowing the lead wires 23 to be embedded in the respective elastic arms 27, or the wires can be run externally of the elastic arms. The previous embodiments explain the case when the elastic arms 27, 27 are integrally formed with the bobbin 24. However, for example, individual and separate elastic arms 27, 27 may be pressed fit with the bobbin 24 or may be fixed with the bobbin 24 by traditional fixing means such as adhesion and heat welding.

Due to the flexibility of elastic arms 27, the present invention eliminates the need to provide an additional part, such as an interrupting conductor, which is commonly used in current pressure control devices. Because no interrupting conductor or other additional part is necessary, the direct connection of the conductor of the coil with the control circuit board allows greater ease of manufacturing pressure control devices, and a reduction in their cost. Since the elastic arm(s) may be integrally formed with the bobbin, no additional manufacturing process for the formation is necessary, thereby facilitating the manufacturing process.

Setting the protruding direction and length of the elastic arm allows the location of the electrical connection between the elastic arm and the control circuit board to be custom designed. Advantageously, any dead space on the control circuit board may be used to locate the lead wire terminal connection, which enables a minimized control circuit board. Since the elastic arms are multidirectionally flexible, they effectively allow the movement of the coil in any direction, while preventing stress on the electrical connection between the control circuit board and the lead wire terminal, as well as on the connection between the coil and the lead wire terminal. Even if the cover is pressed on the valve block, the movement of the coil is allowed by the lead wire terminal without transmitting the movement energy, thereby giving a higher sealing effect.

It should be understood that the specific form of the invention here in above described is intended to be representative only, as certain modifications within the scope of these teachings will be apparent to those skilled in the art. Accordingly, reference should be made to the following claims in determining the full scope of the invention.

What is claimed is:

1. A pressure control device, comprising:
   a plurality of solenoid valves mounted in a valve block, each of said plurality of solenoid valves including a dome type valve body surrounded by a doughnut-shaped coil;
   a cover mounted on said valve block and covering said solenoid valves;
   a control circuit board mounted outside of said cover;
   at least one flexible, elastic arm extending from each said coil;
   at least one lead wire terminal running concurrently with one of said flexible elastic arms and electrically connecting each said coil, respectively, with said control circuit board; wherein said at least one flexible elastic arm absorbs relative movement between said coil and said control circuit board and prevents translation of the movement to the electrical connection between said lead wire terminal and said control circuit board.

2. The pressure control device of claim 1, wherein each said doughnut shaped coil comprises a bobbin having a solenoid coil wrapped therearound, and wherein said at least one flexible, elastic arm extending therefrom is molded together with said bobbin.

3. The pressure control device of claim 1, wherein each said doughnut shaped coil comprises a bobbin having a solenoid coil wrapped therearound, and wherein said at least one flexible, elastic arm extending therefrom is press fitted, adhered, or heat welded to said bobbin.

4. The pressure control device of claim 1, wherein said flexible, elastic arms extend radially away from said coils, and are flexible to absorb axial, radial and torsional movements between said coils and said control circuit board.

5. The pressure control device of claim 1, wherein said flexible elastic arms are at least partially formed in a bellows or corrugated configuration.

6. The pressure control device of claim 2, wherein said flexible elastic arms are at least partially formed in a bellows or corrugated configuration.

7. The pressure control device of claim 1, wherein said at least one lead wire terminal is at least partially formed in a bellows or corrugated configuration.

8. The pressure control device of claim 1, wherein a pair of said lead wire terminals is run along or embedded in one of said flexible elastic arms.

9. The pressure control device of claim 1, wherein a pair of said flexible elastic arms extends from each said coil, and a respective lead wire terminal is run along or embedded in each of said flexible elastic arms.

10. A flexible connection between a coil and a control circuit board of a pressure control device, comprising:
   at least one flexible, elastic arm extending from said coil;
   at least one lead wire terminal running concurrently with one of said flexible elastic arms and electrically connecting said coil with said control circuit board;
   wherein said at least one flexible arm absorbs relative movement between said coil and said control circuit board and prevents translation of the movement to the electrical connection between said lead wire terminal and said control circuit board.

11. The flexible connection of claim 10, wherein said coil comprises a bobbin having a solenoid coil wrapped therearound, and wherein said at least one flexible, elastic arm extending therefrom is molded together with said bobbin.

12. The flexible connection of claim 10, wherein said coil comprises a bobbin having a solenoid coil wrapped therearound, and wherein said at least one flexible, elastic arm extending therefrom is press fitted, adhered, or heat welded to said bobbin.

13. The flexible connection of claim 10, wherein said at least one flexible, elastic arm extends radially away from said coil, and is flexible to absorb axial, radial and torsional movements between said coil and said control circuit board.

14. The flexible connection of claim 10, wherein said at least one flexible, elastic arm is at least partially formed in a bellows or corrugated configuration.

15. The flexible connection of claim 10, wherein said at least one lead wire terminal is at least partially formed in a bellows or corrugated configuration.

16. The flexible connection of claim 10, wherein a pair of said lead wire terminals is run along or embedded in one of said flexible elastic arms.

17. The flexible connection of claim 10, wherein a pair of said flexible elastic arms extends from said coil, and a respective lead wire terminal is run along or embedded in each of said flexible elastic arms.

\* \* \* \* \*